United States Patent
Di Vincenzo et al.

(10) Patent No.: US 8,754,695 B2
(45) Date of Patent: Jun. 17, 2014

(54) METHODS, INTEGRATED CIRCUITS, APPARATUSES AND BUFFERS WITH ADJUSTABLE DRIVE STRENGTH

(75) Inventors: Umberto Di Vincenzo, Capriate San Gervasio (IT); Marco Sforzin, Cernusco Sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 182 days.

(21) Appl. No.: 13/221,752

(22) Filed: Aug. 30, 2011

(65) Prior Publication Data
US 2013/0049817 A1    Feb. 28, 2013

(51) Int. Cl.
   *H03H 11/26* (2006.01)
(52) U.S. Cl.
   USPC .......................... 327/262; 327/263; 327/266
(58) Field of Classification Search
   USPC ................... 327/262, 263, 264, 266
   See application file for complete search history.

(56) References Cited

U.S. PATENT DOCUMENTS

| | | | |
|---|---|---|---|
| 6,044,027 A * | 3/2000 | Zheng et al. | 365/194 |
| 6,060,938 A | 5/2000 | Morrill | |
| 6,262,616 B1 * | 7/2001 | Srinivasan et al. | 327/264 |
| 6,570,406 B2 | 5/2003 | Tang et al. | |
| 7,005,903 B2 | 2/2006 | Chan et al. | |
| 7,019,551 B1 | 3/2006 | Biesterfeldt | |
| 7,068,090 B2 * | 6/2006 | Hirabayashi et al. | 327/307 |
| 7,646,208 B2 * | 1/2010 | Ferraiolo et al. | 324/764.01 |
| 7,944,262 B2 * | 5/2011 | Kuroki et al. | 327/175 |
| 2003/0025541 A1 * | 2/2003 | Humphrey et al. | 327/170 |
| 2009/0115465 A1 | 5/2009 | Garcia et al. | |
| 2009/0289679 A1 * | 11/2009 | Kuroki et al. | 327/175 |

* cited by examiner

*Primary Examiner* — Ryan Jager
(74) *Attorney, Agent, or Firm* — Dorsey & Whitney LLP

(57) ABSTRACT

Buffers, integrated circuits, apparatuses, and methods for adjusting drive strength of a buffer are disclosed. In an example apparatus, the buffer includes a driver. The driver includes a pull-up circuit coupled to a supply voltage node and an output node, and also includes a pull-down circuit coupled to a reference voltage node and the output node. A drive adjust circuit is coupled to at least one of the pull-up circuit and the pull-down circuit, with the drive adjust circuit configured to receive a feedback signal and, based at least in part on the feedback signal, adjust a current conducted through the at least one of the pull-up and pull-down circuits.

27 Claims, 7 Drawing Sheets

METHODS, INTEGRATED CIRCUITS, APPARATUSES AND BUFFERS WITH ADJUSTABLE DRIVE STRENGTH

TECHNICAL FIELD

Embodiments of the invention relate generally to integrated circuits, and more particularly, in one or more of the illustrated embodiments, to buffers with adjustable drive strength.

BACKGROUND OF THE INVENTION

Signals in integrated circuits are generally propagated along interconnect lines (e.g., electrically conductive features, such as, wires, traces and the like) that couple various transistors and other circuit components together. In some cases, these lines can be relatively long and can introduce delays, noise, and signal degradation. Usually, the longer the line, the longer the delay and the more prone to noise and degradation the signal can be. The delay, noise, and signal degradation, however, can be reduced by splitting the line into segments and inserting buffers (e.g. repeaters) to help drive the signal along the line. These buffers may in some embodiments include one or more inverters, each formed, for example, with a p-channel field effect transistor (pFET) with its source coupled to a supply voltage node, such as VCC, and its drain coupled to the drain of an n-channel field effect transistor (nFET). The source of the nFET may be coupled to a reference voltage node, such as ground. As an input signal applied to the gates of the nFET and pFET changes (e.g., as a signal propagates through the inverter(s)), the output signal may transition (e.g., switch) between logical high ('1') and logical low ('0') values. The signals may be data signals, clock signals, or any other type of signal.

The frequency at which a device can be operated depends in part on various delays to the signals as they propagate along (e.g. pass through) the lines of an integrated circuit. The delays may include transition delays (i.e., the delay incurred when the signal transitions from a logical high to a logical low, or vice versa), propagation delays between different sequential or combinational circuits, and so forth. Generally, the shorter the delays, the faster the frequency at which the device can be operated. In other words, as the operating frequency of a device increases, signal delays generally must become shorter.

Devices with Dual Data Rate (DDR) lines transfer data on both the rising and falling edges of a clock signal, thereby doubling the effective bandwidth or throughput of the line as compared to a non-DDR device. However, because both edges of a clock signal contain information, the timing of the signals generally should be more precise. For example, the rising edge of a clock or data signal may need to be shaped substantially similar to the falling edge of the signal in order to ensure that the signal transitions meet a certain specification or to ensure that data is available as required.

Drive strength is the relative ability of a circuit, such as a buffer, to source or sink current during the transition of logical states of a propagating signal. Drive strength is often characterized separately for different FETs in a circuit, such as the pull-up pFET of an inverter and the pull-down nFET of the inverter. Taking an inverter as an example, the rate at which it can transition its output node from a logical high to a logical low voltage level depends in part on the drive strength of the pull-down nFET. Specifically, the drive strength of the pull-down nFET influences the rate that the inverter will be able to discharge the output node to a reference voltage node, such as ground. The rate at which the inverter can transition its output node from a logical low to a logical high voltage level depends in part on the drive strength of the pull-up pFET in the circuit. Specifically, the drive strength of the pull-up pFET influences how fast or how slow the circuit will be able to charge the output node from a supply voltage node, such as VCC, a pumped voltage Vccp, or a voltage stepped down from Vcc. The drive strength of the pull-up and pull-down FETs is inversely related to the delay incurred during signal transitions because the greater the drive strength of the FETs, the faster the inverter or other circuit will be able to change the voltage on its output node.

The shape of the output signal at the output node is determined by the pull-up and pull-down rates. Specifically, the shape of the output signal falling from high-to-low is determined by the pull-down rate, while the shape of the output signal rising from low-to-high is determined by the pull-up rate.

The drive strength of a FET may be a function of, among other things, the geometry of the FET, such as its W/L ratio and the carrier type (i.e. electrons in nFETs and holes in pFETs). Specifically, the larger the W/L ratio, the greater the drive strength. Also, for the same geometry, nFETs typically have greater drive strengths than pFETs due to the higher relative mobility of the electron carriers in nFETs as compared with the hole carriers in pFETs.

In order to have substantially symmetric high-to-low and low-to-high output signal shapes for an inverter, the drive strength of the pull-up pFET may need to be substantially equal to the drive strength of the pull-down nFET. For example, substantially equal drive strengths may be drive strengths of the pull-up and pull-down transistors provide transitions from low-to-high takes approximately the same time as transitions from high-to-low. In some embodiments, substantially equal may mean within +/−10% of one another. Substantially symmetric may mean rise time and fall time are within +/−10%. As the load capacitance seen at the output node does not usually change, the load will be able to charge during a low-to-high transition at the same rate as the load discharges during a high-to-low transition if the respective nFET and pFET have similar drive strength (e.g. current capabilities). For other circuits, the drive strength of the pull-up circuit may need to be substantially equal to the drive strength of the pull-down circuit in order to similarly have substantially symmetric high-to-low and low-to-high output signal shapes.

Taking an inverter again as an example, circuit designers typically try to equate the drive strength of its pFET with the drive strength of its nFET by altering the geometries of one of the FETs. For example, if the nFET has a minimum channel length and width, the pFET is designed with a width that is some factor (e.g. 2.5×) larger than the nFET to compensate for the holes of the pFET having a lower mobility and/or to compensate for differing levels of doping. The factor is processing technology dependent, and is usually obtained by taking the difference in hole and electron mobility and extrapolating how much wider a pFET needs to be to drive the same amount of current as an nFET.

However, despite attempts to equate the drive strength of an nFET and a pFET in, for example, an inverter, by widening the channel of the pFET, the actual drive strengths of the nFET and pFET in operation may differ. The difference may be, for example, due to temperature variations, doping or other manufacturing variations, and so forth. As discussed above, this difference in drive strength may lead to output signals that are not symmetrically shaped for the high-to-low and the low-to-high transitions, thus potentially leading to unanticipated or undesirable delay differences in signal propagation.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
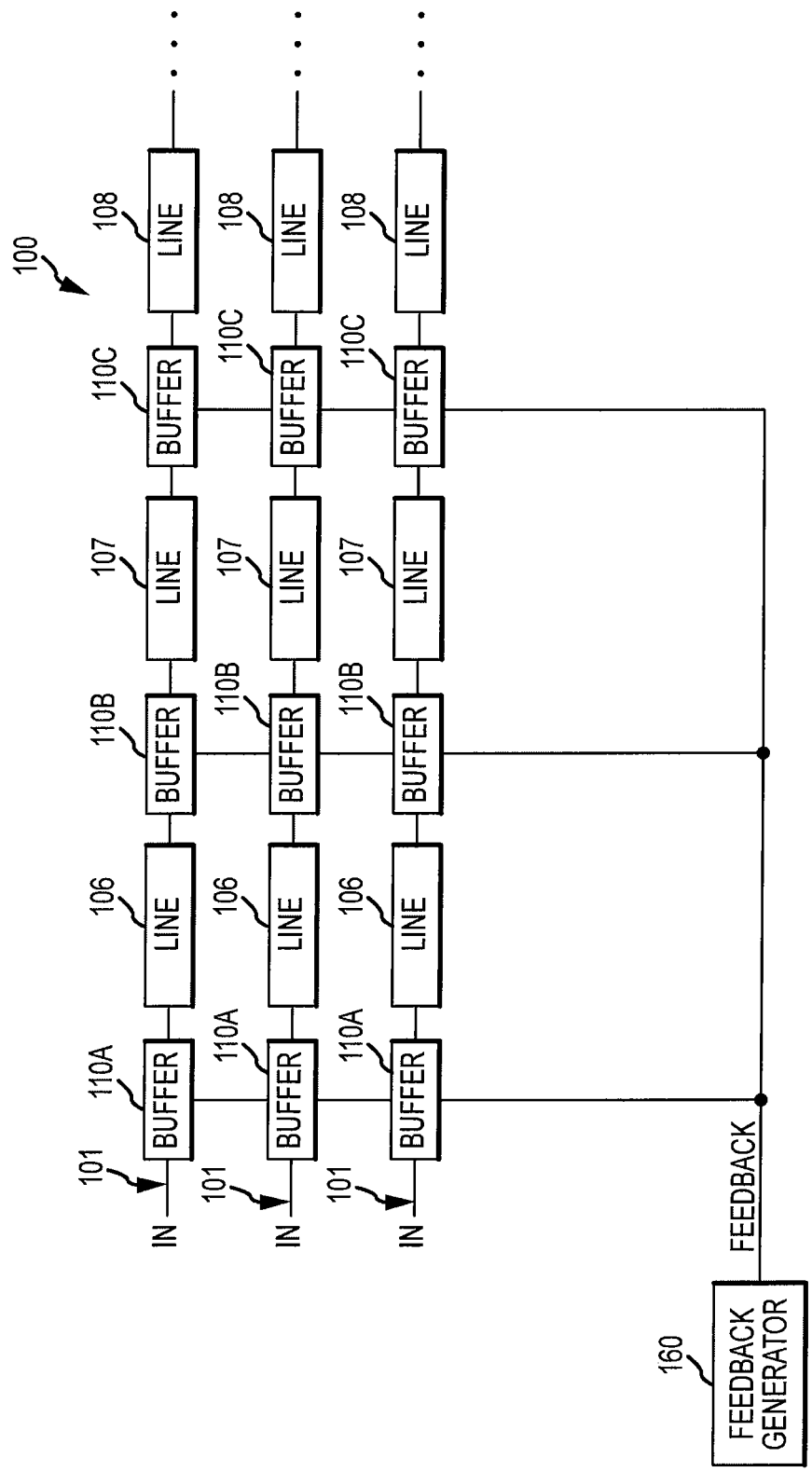
FIG. 1 is a block diagram of interconnect lines with adjustable buffers according to an embodiment of the present invention.

FIG. 1 illustrates an apparatus that includes three interconnect lines 101 in an integrated circuit 100 according to an embodiment of the invention. The three interconnect lines 101 each receive an input signal IN that is to be propagated through the lines. Each of the lines 101 is split into segments 106, 107, 108, and are coupled to buffers 110A, 110B, and 110C that are placed before each segment in order to receive the signal from the previous segment, as in the case of buffer 110A, from a signal source (such as a gate, flip-flop, etc.) and to drive the signal onto the next segment of the line. Specifically, for the top line 101 in FIG. 1, a buffer 110A receives the IN signal from a signal source and drives the signal onto segment 106 of the line 101. Another buffer 110B receives the signal from segment 106 and drives the signal onto the segment 107 of the line 101. Another buffer 110C receives the signal from the segment 107 and drives the signal onto segment 108 of the line 101. The signal may be a data signal, a clock signal, or any other signal. In general, the number of segments the line 101 is split into may depend on, among other things, the overall length of the line 101, or the desired operating frequency of the integrated circuit 100.

As explained in more detail below, the buffers 110A, 110B, 110C in FIG. 1 may include one or more drivers, and the buffers and/or drivers may in some embodiments vary amongst themselves in order to drive varying lengths of line segments and loads. For example, the configuration of the buffers 110A, 110B, 110C may depend, among other things, on the length of the line segment the buffer is to drive, the load at the end of the line segment, and so forth. For example, one buffer may be configured to drive a longer line (thus presenting more capacitance at the output node of the buffer) than a second buffer, and so on.

A feedback generator 160, shown coupled to the buffers 110A, 110B, 110C in FIG. 1, may provide a feedback signal to each of the buffers. In some embodiments, a single feedback generator may be provided (as in FIG. 1) while in other embodiments a plurality of feedback generators may provide a plurality of similar or dissimilar feedback signals to one or more buffers. As explained in more detail below, the feedback generator in FIG. 1 generates a feedback signal that, when provided to the buffers 110A, 110B, 110C, adjusts the effective drive strength of pull-down circuit(s) and/or pull-up circuit(s) of the buffers so that the transition rates of the rising and falling edges of a signal (and thus the output signal shapes) are substantially symmetrical.

Figure 2:
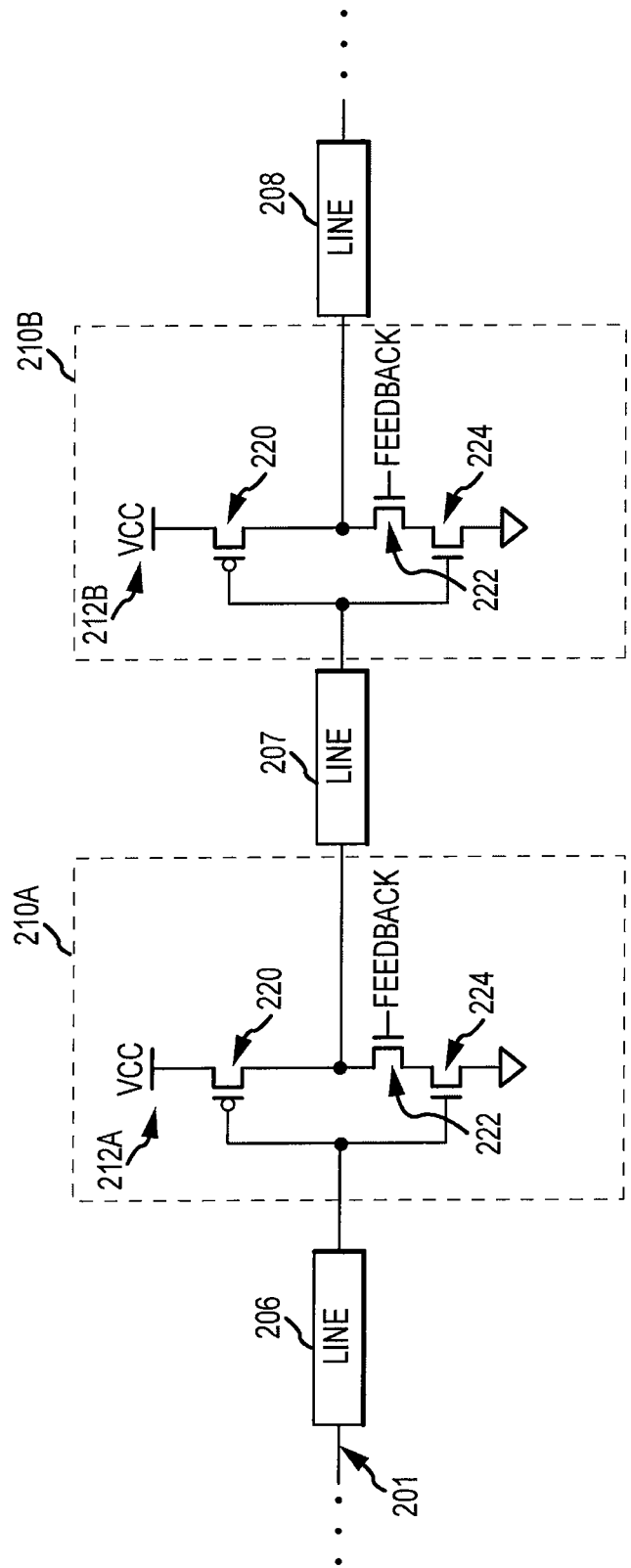
FIG. 2 is a schematic diagram of an interconnect line with two adjustable buffers according to an embodiment of the invention.

FIG. 2 illustrates an interconnect line 201 split into three segments 206, 207, 208 coupled to buffers 210A and 210B according to an embodiment of the invention. The buffer 210A receives a signal from segment 206 and drives the signal onto segment 207. The buffer 210B receives the signal from segment 207 and drives the signal onto segment 208. Both of the buffers 210A, 210B receive a feedback signal, which in FIG. 2 is the same feedback signal.

Each of the buffers 210A, 210B includes a driver 212A, 212B. Each driver 212A, 212B is a modified inverter with a pull-up circuit 220, a pull-down circuit 224, and a drive adjust circuit 222 coupled in series with the pull-down circuit. The pull-up circuit 220 is illustrated as a pFET, and the pull-down and drive adjust circuits 224, 222 are illustrated as nFETs in FIG. 2. Other types of pull-up, pull-down, and drive adjust circuits may be used as well. The pull-up circuit 220 in the driver 212A of the buffer 210A is coupled to a supply voltage node, such as VCC, and to the output node of the buffer (which is in turn coupled to segment 207 of the line 201). The pull-up circuit 220 is further coupled to an input node of the buffer (which is in turn coupled to the previous segment 206 of line 201). The pull-down circuit 224 is coupled to a reference voltage node, such as ground, and coupled to the output node of the buffer through the drive adjust circuit 222. The pull-down circuit 224 is also coupled to the input node of the buffer. The drive adjust circuit 222 is coupled to the output node of the buffer and to the pull-down circuit 224. The drive adjust circuit 222 is provided a feedback signal, generated by a feedback generator (not shown in FIG. 2). The buffer 210B is configured with a driver 212B similar to the driver 212A, and is coupled between segment 207 and segment 208 of the line 201.

Ignoring the operation of the drive adjust circuit 222 for the time being, and assuming that it is fully conductive, the pull-up circuit 220 and the pull-down circuit 224 invert the signal received from the previous line segment at the input of the respective driver 212A, 212B, buffer the signal, and provide the inverted, buffered signal to the next line segment. If the input is a logical high, the pull-up circuit 220 is not conductive, and the pull-down circuit 224 is conductive, thereby pulling down the output of the respective driver 212A, 212B to logical low. If the input is a logical low, the pull-down circuit 224 is not conductive, and the pull-up circuit 220 is conductive, thereby pulling up the output of the respective driver 212A, 212B to logical high.

The pull-up and pull-down circuits in the drivers 212A, 212B, and the drive adjust circuit 222 are configured such that the pull-down current drive strength of the series combination of fully conductive drive adjust and pull-down circuits 222, 224 is greater than the pull-up current drive strength of the pull-up circuit 220. The feedback signal provided to the drive adjust circuit 222 may adjust the pull-down drive strength of the drive adjust circuit 222 so that the effective pull-down drive strength of the pull-down circuit (i.e. the drive strength of the series combination of the drive adjust circuit 222 and the pull-down circuit 224) is substantially equal to the drive strength of the pull-up circuit 220. That is, by having substantially equal drive strengths, the transition from low-to-high and the transition of high-to-low may be approximately the same time. By adjusting (e.g. calibrating) the effective pull-down strength to be substantially equal to the pull-up strength, the current flowing through the pull-up circuit 220 when the input to the driver is a logical low may be substantially the same as the current flowing through the drive adjust and pull-down circuits 222, 224 when the input to the driver is a logical high. As illustrated by this example, the feedback signal may thus adjust the drivers 212A, 212B such that the output signals are substantially symmetrical for high-to-low and low-to-high transitions.

The feedback signal provided to the drivers 212A, 212B within the buffers 210A, 210B in FIG. 2 is the same for both buffers because both buffers in FIG. 2 have a substantially similar driver 212A, 212B. In other embodiments, however, and as explained in more detail below, the feedback signals provided to different buffers and/or to different drivers within a buffer may be different. The feedback signal provided to the drivers 212A, 212B within the buffers 210A, 210B in FIG. 2 may be a relatively constant voltage. Additionally, the feedback signal may be less than the supply voltage, for example, the feedback signal may be approximately 1.2 volts for an integrated circuit with a supply voltage of 1.8 volts. The voltage of the feedback signal may vary in some cases, such as if the temperature of the circuit changes, but otherwise remains relatively constant.

The feedback signal voltage may be used to control the drive adjust circuit 222 to restrict the current flowing through the pull-down circuit 224 by essentially operating as a series coupled resistor. As the feedback signal voltage increases, the drive adjust circuit 222 becomes more conductive and presents a lower effective resistance, thereby increasing the current drive capability for pull-down for a given output voltage. As the feedback signal voltage decreases, the drive adjust circuit 222 becomes less conductive and presents a higher effective resistance, thereby decreasing the current drive capability for pull-down for a given output voltage. In this manner, the feedback signal adjusts the pull-down strength (through the drive adjust and pull-down circuits 222, 224) by only allowing it to drive as much current as the pull-up circuit (i.e., pull-up circuit 220) of the driver.

As will be explained in more detail below, the feedback signal is generated using models of the drivers 212A, 212B, such as by measuring the actual operating conditions and adjusting the feedback signal accordingly in order to adjust the effective drive strength of the pull-down circuit of the drivers 212A, 212B.

Because the output signal shapes for the high-to-low and for the low-to-high transitions for the buffer 210A are substantially symmetric, and because the output signal shapes for the high-to-low and the low-to-high transitions for the buffer 210B are substantially similar to the high-to-low and the low-to-high transitions in the buffer 210A, high frequency signals may be propagated along line 201 in, for example, a DDR device.

Figure 3:
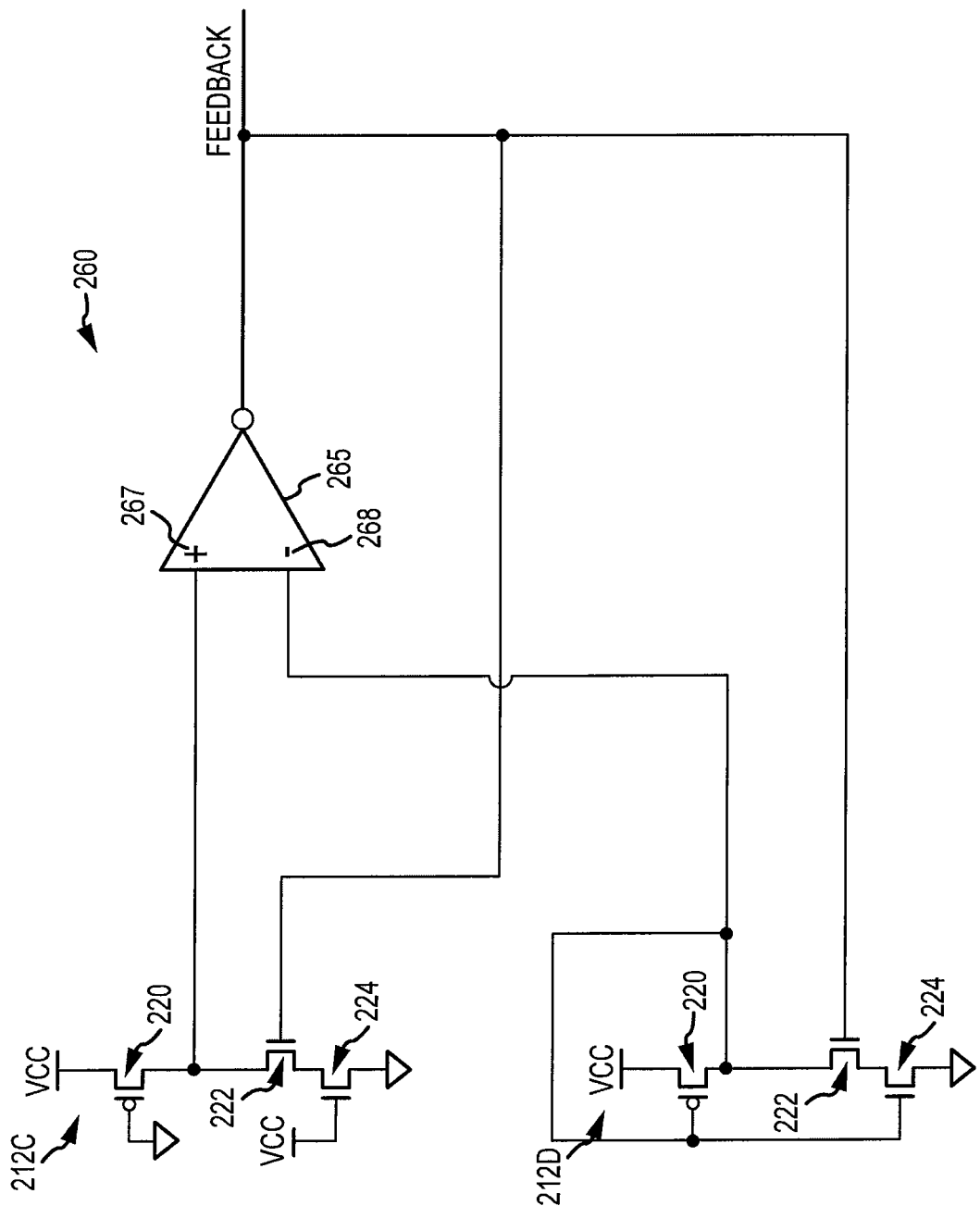
FIG. 3 is a schematic diagram of a feedback generator according to an embodiment of the invention.

FIG. 3 illustrates a feedback generator 260 according to an embodiment of the invention. The feedback generator 260 illustrated in FIG. 3 may be used to generate the feedback signal for the drivers 212A, 212B in FIG. 2, and may correspond to the feedback generator 160 illustrated in FIG. 1. The feedback generator 260 includes two drivers 212C, 212D and a differential amplifier 265. The two drivers 212C, 212D illustrated in FIG. 3 model the drivers 212A, 212B, in FIG. 2. The driver 212C is coupled to a positive input node 267 and the driver 212D is coupled to a negative input node 268. Generally, the positive input node 267 is coupled to a circuit modeling a driving circuit and the negative input node 268 is coupled to a circuit modeling a receiving circuit. With reference to FIGS. 2 and 3, for example, the driver 212C models driver 212A (i.e., the driving circuit) and driver 212D models driver 212B (i.e., the receiving circuit).

In some embodiments the drivers 212C, 212D have substantially similar operational characteristics as drivers 212A, 212B. For example, the drivers 212C, 212D and drivers 212A, 212B may have substantially similar geometries, that is, approximately the same W/L ratios. The threshold voltages of the drivers 212A, 212B and 212C, 212D may be approximately the same and provide similar magnitudes of currents responsive to similar gate voltages. In other embodiments, however the two drivers 212C, 212D in the feedback generator 260 of FIG. 3 may be differently sized models of the drivers 212A, 212B of FIG. 2.

Similar to the drivers 212A, 212B in FIG. 2, the drivers 212C, 212D illustrated in FIG. 3 each have a pull-up circuit (e.g., pFET) 220, a pull-down circuit 224, and a drive adjust signal 222 (e.g., nFETs). The pull-up circuit 220 of the driver 212C in FIG. 3, however, is coupled to a reference voltage node, such as ground, and the pull-down circuit nFET 224 is coupled to a supply voltage node, such as VCC. As a result, both the pull-up and pull-down circuits are fully conductive. The drive adjust circuit 222 is provided the same feedback signal as the drive adjust circuits 222 of drivers 212A, 212B in FIG. 2. The output of the driver 212C in FIG. 3 is coupled to the positive input node 267 of a differential amplifier 265.

The pull-up circuit 220 and the pull-down circuit 224 of the driver 212D in FIG. 3 are both coupled to the driver's output (thereby short circuiting the input node of the driver 212D to its output node). The drive adjust circuit 222 is provided the same feedback signal as the drivers 212A, 212B in FIG. 2 and the driver 212C in FIG. 3. The output of the driver 212D is coupled to the negative input node 268 of the differential amplifier 265. The output of the differential amplifier 265 provides the feedback signal to the drivers 212A, 212B, 212C, 212D.

In some embodiments, in order to reduce the consumption of static power dissipated in the feedback generator, the model drivers 212C, 212D may be scaled with lower W/L ratios of the pull-up and pull-down circuits, so long as the ratio of the W/L ratio of the pull-up circuits to the W/L ratio of the pull-down circuits remains constant between the model drivers 212C, 212D and the actual drivers 212A, 212B.

With reference to FIGS. 2 and 3, the feedback generator 260 provides the feedback signal to the drivers 212A, 212B in the buffers 210A, 210B in FIG. 2 in order to adjust the effective pull-down drive strength to be substantially the same as the pull-up drive strength of the drivers.

The driver 212D in FIG. 3 models a driver (e.g., 212B) from FIG. 2 that is receiving a signal. The driver 212D does this by providing the threshold voltage of the driver 212B in FIG. 2, with the threshold voltage being the input voltage at which the current flowing through the pull-up circuit 220 is the same as the current flowing through the drive adjust and pull-down circuits 222, 224. In other words, the threshold voltage provided by the driver 212D in FIG. 3 is the input voltage at which both the pull-up circuit 220 and pull-down circuit 224 of the driver 212B are partially on and conducting the same amount of current. The threshold voltage may, in some embodiments, be approximately half of the supply voltage because, with all of the circuits 220, 222, 224 partially on and thus behaving as resistors, the circuits 220, 222, and 224 form a voltage divider.

The driver 212C in FIG. 3 models a driver (e.g., 212A) from FIG. 2 that is driving a signal. The differential amplifier 265 generates the feedback signal by amplifying the difference between the input voltages received at its input nodes 267, 268. The feedback signal voltage is then provided to the drive adjust circuits 222 of both of the drivers 212C, 212D in FIG. 3, such that the two drivers 212C, 212D have a substantially equal output voltage. Specifically, the feedback signal from the differential amplifier 265 adjusts the voltage of the feedback signal to the drive adjust circuit 222 of the driver 212C in FIG. 3 until the output of the driver 212C is equal to the threshold voltage being generated by the driver 212D. Because the feedback signal from the differential amplifier 265 is also provided to the drive adjust circuit 222 of the driver 212D, the differential amplifier 265 finds the cross point where the model drivers 212C, 212D have the same output for the same given feedback signal voltage (even though the respective pull-up and pull-down circuits 220, 224 are provided different inputs).

In operation, the conductivity of the drive adjust circuit 222 is controlled by the voltage of the feedback signal, and may be used to restrict the effective drive strength of the pull-down circuit 224 of the driver 212C to that of its pull-up circuit 220, so that the output of the driver 212C is substantially equal to the threshold voltage provided by the driver 212D. In other words, the feedback generator 260 generates a feedback signal that configures the driver 212C so that when its output is equal to the threshold voltage of the driver 212D (which is the same as the threshold voltage of the driver 212B in FIG. 2), the current flowing in the pull-up circuit 220 of the driver 212C is the same as the current flowing in its pull-down circuit 224, thereby statically dissipating that current. Because driver 212C in FIG. 3 models driver 212A in FIG. 2, the feedback signal, if in turn provided to the driver 212A, will adjust the pull-down drive strength to be substantially equal to the pull-up drive strength. Also, because driver 212B in FIG. 2 is substantially the same as driver 212A in FIG. 2, the same feedback signal, if provided to the driver 212B, will adjust the pull-down drive strength to be substantially equal to the pull-up drive strength. In this manner, the shape of output transitions of the drivers 212A, 212B and their respective buffers 210A, 210B, will be substantially similar to each other, and the shape of the rising transition output will be substantially symmetric to the shape of the falling transition output.

By using actual models 212C, 212D of a driving driver 212A and a receiving driver 212B (which, in FIG. 2, are substantially similar), the feedback generator 260 can dynamically adjust the feedback signal provided to the drivers 212A, 212B based on the actual operating conditions (e.g., temperature, silicon properties) of the drivers, and can adjust the feedback signal to account for changes that occur. Moreover, because the driving driver 212A is substantially similar to the receiving driver 212B, a single feedback signal can be used to do so. The feedback generator 260 can thus adjust the drive strengths of the driving driver (e.g., 212A) so that the current flowing through its pull-up circuit is the same as the current flowing through its pull-down circuit when its output value is the threshold voltage of the next stage driver (i.e., the driver driven by the driving driver), in every condition.

In some embodiments, the drive strength of one or both of the buffers 210A, 210B in FIG. 2 may be increased by adding additional drivers in parallel to the driver illustrated within each buffer. For example, if line segment 208 is particularly long or has a particularly large load at the end, buffer 210B may be scaled to include a plurality of drivers 212B in parallel with each other. Each of these drivers 212B may be a standard sized driver substantially similar to that illustrated in FIG. 2, but because the plurality of drivers are coupled in parallel, they will contribute to the drive strength to drive line segment 208. If each of the parallel drivers 212B are substantially similar, for example, to the single driver 212B illustrated in the buffer 210B in FIG. 2, they may all receive the same feedback signal as the single driver 212B.

Figure 4:
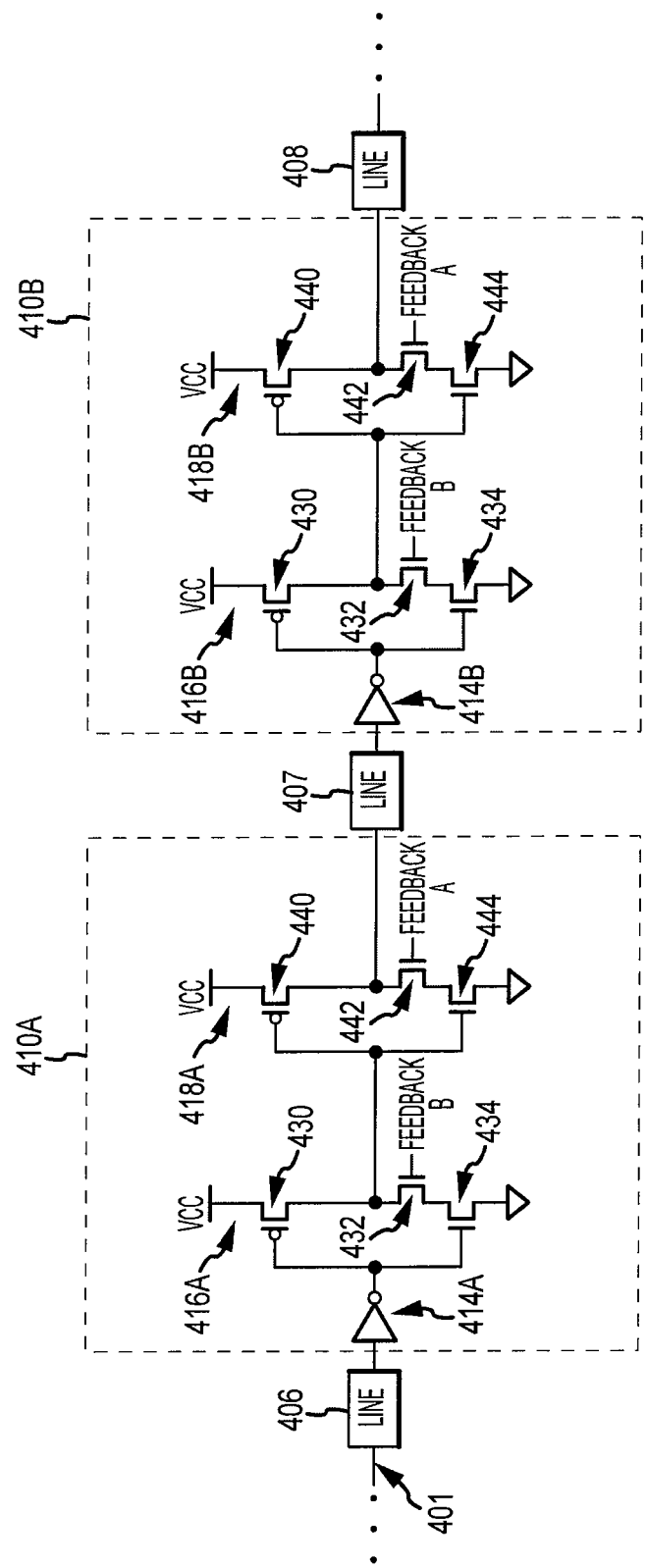
FIG. 4 is a schematic diagram of an interconnect line with two adjustable buffers according to an embodiment of the invention.

FIG. 4 illustrates an interconnect line 401 split into three segments 406, 407, 408 coupled to buffers 410A and 410C according to an embodiment of the invention. The buffer 410A may be coupled between segments 406, 407 of line 401, and buffer 410B may be coupled between segments 407, 408 of line 401. In contrast to the buffers 210A, 210B in FIG. 2, the buffers 410A, 410B in FIG. 4 are multi-stage buffers that each include three serially coupled drivers 414, 416, 418.

The driver 414A of the buffer 410A in FIG. 4 is illustrated as an inverter 414A and is provided a signal from the previous segment 406 of the line 401. The inverter 414A may in some embodiments be configured to minimize the load capacitance driven by the previous buffer (not shown in FIG. 4) that drives segment 406. The driver 416A of the buffer 410A may be a modified inverter similar to the drivers 212A, 212B in FIG. 2 having a pull-up circuit 430, a pull-down circuit 434, and a drive adjust circuit 432. The pull-up circuit 430 may in some embodiments conduct greater pull-up current than the pull-up circuit in the inverter 414A. The driver 418A of the buffer 410A may also be a modified inverter similar to the drivers 212A, 212B in FIG. 2 and also having a pull-up circuit 440, pull-down circuit 444, and drive adjust circuit 442. The pull-up circuit 440 may in some embodiments conduct greater pull-up current than the pull-up circuit 430 of the driver 416A. The pull-up circuits in the inverter 414A, the driver 416A and the driver 418A may conduct increasing pull-up current in order to reduce the signal propagation time through the buffer while still having sufficient drive strength to drive a particular line or other load. In other words, in addition to calibrating the pull-down drive strengths in one or more driver(s), the overall drive strengths of the buffers 410A, 410B can be scaled by using different physically dimensioned FETs for one or more drivers within the buffers. This is in contrast to using a single sized driver (as was illustrated in FIG. 2) and scaling the overall drive strength of the buffers by coupling multiple standard sized drivers in parallel. However, because the drivers 416A, 418A illustrated in FIG. 4 may have different physically dimensioned FETs to provide increasing pull-up and pull-down currents, they may in some embodiments need different feedback signals, illustrated as feedback A and feedback B in FIG. 4. The buffer 410B is configured with drivers 414B, 416B, 418B similar to the drivers 414A, 416A, 418A in the buffer 410A, but the buffer 410B is coupled between segment 407 and segment 408 of the line 401.

Figure 5:
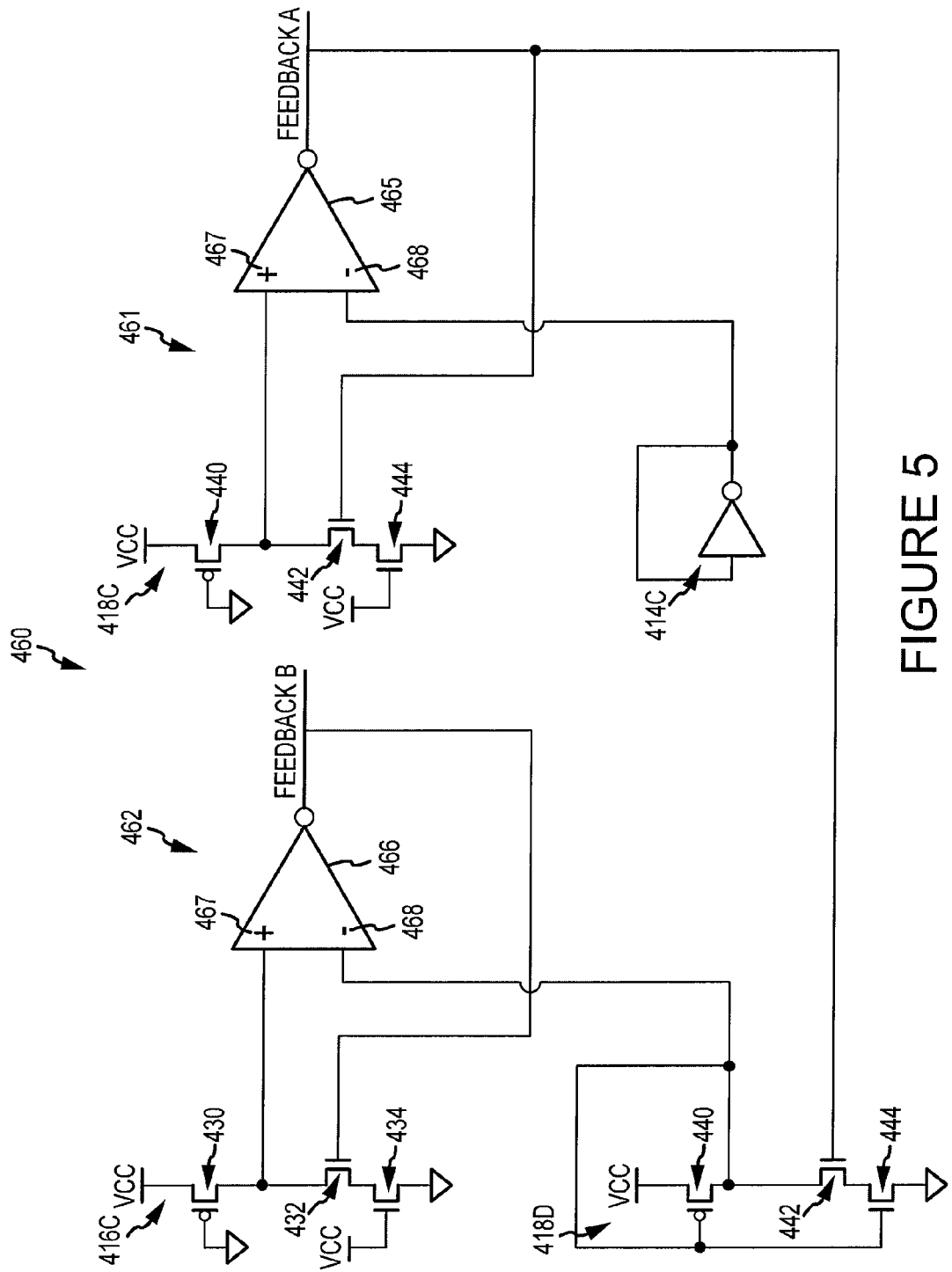
FIG. 5 is a schematic diagram of a feedback generator according to an embodiment of the invention.

FIG. 5 illustrates a feedback generator 460 according to an embodiment of the invention. The feedback generator 460 illustrated in FIG. 5 may be used to generate the feedback A and feedback B signals for the drivers 416A, 418A, 416B, 416B in FIG. 4, and may correspond to the feedback generator 160 illustrated in FIG. 1. The feedback generator 460 includes two portions 461, 462, with the first portion 461 generating the feedback A signal and the second portion 462 generating the feedback B signal.

The first portion 461 of the feedback generator 460 includes a driver/inverter 414C, a driver 418C, and a differential amplifier 465 that generates the feedback A signal. The two drivers 418C, 414C illustrated in FIG. 5 model the drivers 418A, 414B in FIG. 5. In other words, the driver 418C models the driver 418A to which the feedback A signal is to be provided, and the driver 414C models the driver 414B to which the output of the driver 418A is provided. In some embodiments, the models 418C, 414C have substantially similar operating characteristics as the drivers 418A, 414B that they model. For example, the drivers 418C, 414C have substantially similar geometries as the drivers 418A, 414B. In other embodiments, however, the models 418C, 414C may be sized differently than the drivers 418A, 414B.

Similar to the driver 418A in FIG. 4, the driver 418C illustrated in FIG. 5 has a pull-up circuit 440, pull-down circuit 444, and drive adjust circuit 442. The pull-up circuit 440 is coupled to a reference voltage node, such as ground, and the pull-down circuit 444 is coupled to a supply voltage node, such as VCC so that the pull-up and pull-down circuits 440, 444 are fully conductive. The drive adjust circuit 442 is provided the same feedback signal as the drive adjust circuit 442 of the driver 418A in FIG. 4, namely the feedback A signal. The output of the driver 418C in FIG. 5 is coupled to the positive input node 467 of a differential amplifier 465.

Similar to the driver 414B in FIG. 4, the driver 414C illustrated in FIG. 5 is an inverter. The input of the inverter 414B is coupled to the output of the inverter (thereby short circuiting the input node to its output node). The output of the inverter 414C is also coupled to the negative input node 468 of the differential amplifier 465. The output of the differential amplifier 465 provides the feedback A signal to the drivers 418A-418D.

The second portion 462 of the feedback generator 460 includes a driver 416C, a driver 418D, and a differential amplifier 466 that generates the feedback B signal. The two drivers 416C, 418D illustrated in FIG. 5 model the drivers 416A, 418A in FIG. 4. In other words, the driver 416C models the driver 416A to which the feedback B signal is to be provided, and the driver 418D models the driver 418A to which the output of the driver 416A is provided. In some embodiments, the models 416C, 418D have substantially similar operating characteristics as the drivers 416A, 418A that they model. For example, the drivers 416C, 418D have similar geometries as the drivers 416A, 418A, but in other embodiments the models may be sized differently than the drivers that they model.

Similar to the driver 416A in FIG. 4, the driver 416C illustrated in FIG. 5 has a pull-up circuit 430, pull-down circuit 434, and a drive adjust circuit 432. The pull-up circuit 430, however, is coupled to a reference voltage node, such as ground, and the pull-down circuit 434 is coupled to a supply voltage node, such as VCC. As a result, the pull-up and pull-down circuits 430, 434 are fully conductive. The drive adjust circuit 432 is provided the same feedback signal as the driver 416A in FIG. 4, namely the feedback B signal. The output of the driver 416C in FIG. 5 is coupled to the positive input node 467 of a differential amplifier 466.

Similar to the driver 418A in FIG. 4, the driver 418D illustrated in FIG. 5 also has a pull-up circuit 440, a pull-down circuit 444, and a drive adjust circuit 442. The pull-up circuit 440 and the pull-down circuit 444 are, however, both coupled to the output node of the driver 418D (thereby short circuiting the input node of the driver to its output node), and the drive adjust circuit 442 is provided the same feedback signal as the driver 418A in FIG. 4, namely the feedback A signal. The output of the driver 418D in FIG. 5 is coupled to the negative input node 468 of the differential amplifier 466. The output of the differential amplifier 466 provides the feedback B signal to the drivers 416A, 416B, and 416C.

With reference to FIGS. 4 and 5, the feedback generator 460 provides the feedback A and feedback B signal to the drivers 416A, 418A, 416B, 418B in the buffers 410A, 410B in FIG. 4 in order to adjust the pull-down drive strengths within each of the drivers.

The operation of the first and second portions 461, 462 of the feedback generator 460 in conjunction with the buffers 410A, 410B is generally analogous to the operation of the feedback generator 260 in conjunction with the buffers 210A, 210B as described in detail above. Specifically, the feedback generator 460 generates the feedback A and feedback B signals that, when applied to the drivers 418A, 418B and 416A, 416B, adjusts the pull-down drive strengths within each of the drivers to be substantially equal to the pull-up drive strength of the respective drivers. In this manner, the shape of the output transitions of the drivers 416A, 418A, 416B, 418B, and their respective buffers 410A, 410B will be substantially similar to each other, and the shape of the rising transition output will be substantially symmetric to the shape of the falling transition output.

Figure 6:
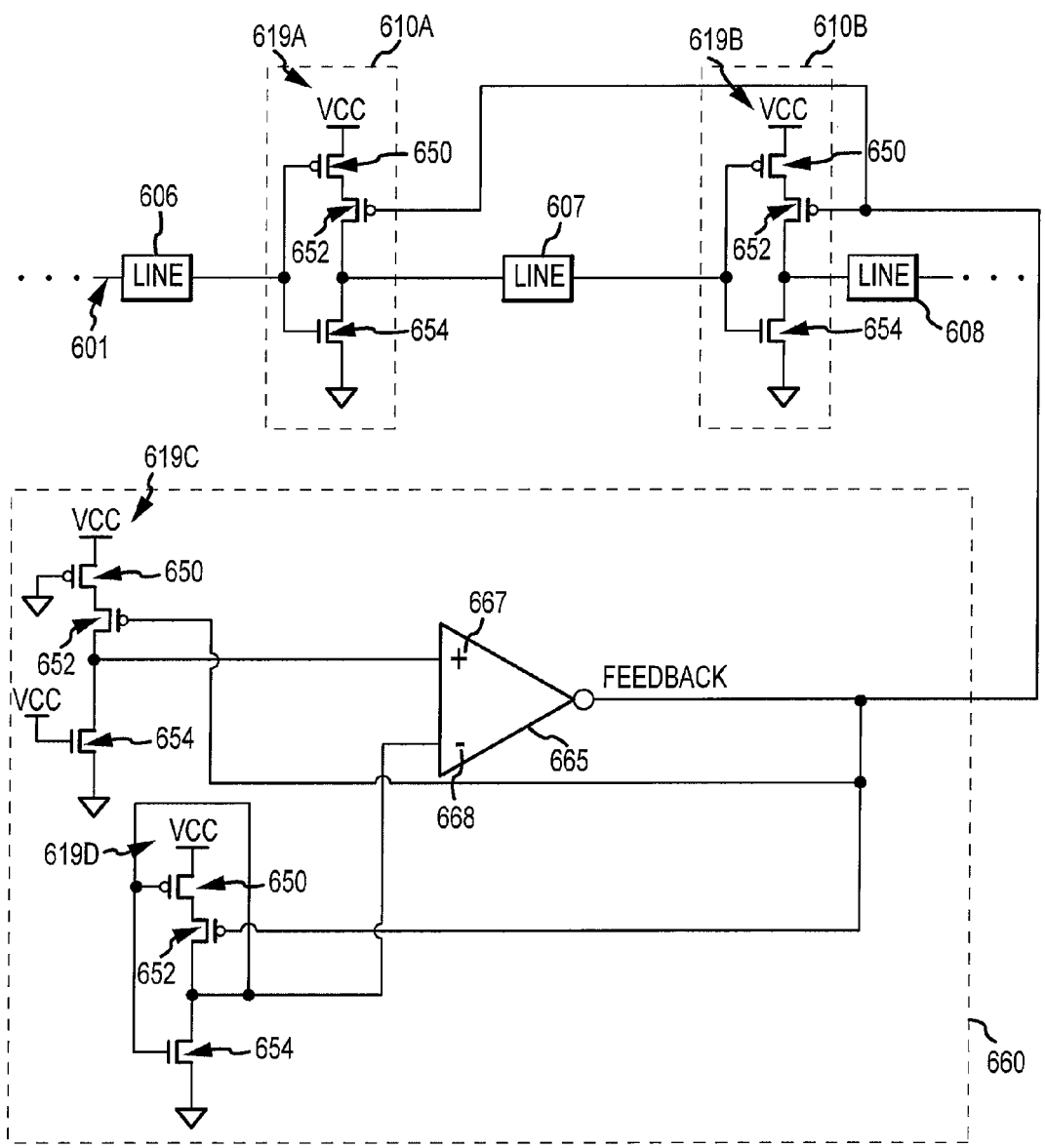
FIG. 6 is a schematic diagram of an interconnect line with two adjustable buffers and a feedback generator according to an embodiment of the invention.

FIG. 6 illustrates an interconnect line 601 split into three segments 606, 607, 608 coupled to buffers 61A, 610B according to an embodiment of the invention. Similar to the embodiment illustrated in FIG. 2, buffer 610A may be coupled between segments 606, 607 of line 601, and buffer 610B may be coupled between segments 607, 608 of line 601. The drivers 619A, 619B within the buffers 610A, 610B are, however, configured differently than the drivers 212A, 212B in FIG. 2.

The driver 619A may be a modified inverter having a pull-up circuit 650 and a drive adjust circuit 652 coupled in series, and a pull-down circuit 654. The pull-up circuit pFET 650 in the driver 619A of the buffer 610A is coupled to a supply voltage node, such as VCC, and the pull-up circuit 650 is also coupled to the buffer output through the drive adjust circuit 652. The drive adjust circuit 652 is coupled to the output node of the buffer (which is in turn coupled to the previous segment 607 of line 601). The pull-down circuit 654 is coupled to the output node of the buffer, and to a reference voltage node, such as ground. The pull-up and pull-down circuits 650, 654 are also coupled to the input node of the buffer. The drive adjust circuit 652 is configured to receive a feedback signal generated by a feedback generator 660. The buffer 610B is configured with a driver 619B similar to the driver 619A, and is coupled between segment 607 and segment 608 of the line 601.

The pull-up and pull-down circuits 650, 654 in the drivers 619A, 619B, as well as the drive adjust circuit 652, are configured such that the pull-up current drive strength of the series combination of fully conductive pull-up and drive adjust circuits 650, 652 is greater than the pull-down current drive strength of the pull-down circuit 654. The feedback signal provided to the drive adjust circuit 652 may adjust the pull-up drive strength of the drive adjust circuit 652 so that the effective pull-up drive strength of the pull-up circuit 650 is substantially equal to the drive strength of the pull-down circuit 654. By adjusting the effective pull-up drive strength of the pull-up circuit 652 to be substantially equal to the pull-down drive strength of the pull-down circuit 654, the current flowing through the pull-up and the drive adjust circuits 650, 652 when the input to the driver is a logical low may be substantially the same as the current flowing through the pull-down circuit 654 when the input to the driver is a logical high. As illustrated by this example, the feedback signal may thus adjust the drivers 619A, 619B such that the output signals are substantially symmetrical for high-to-low and low-to-high transitions.

The feedback generator 660 provides a feedback signal to the drivers 619A, 619B. The feedback generator 660 includes drivers 619C, 619D having outputs coupled to a positive input node 667 and to a negative input node 668, respectively, of a differential amplifier 665. The drivers 619C, 619D model the drivers 619A, 619B, and in some embodiments have substantially similar operational characteristics as those drivers. For example, the drivers 619C, 619D and drivers 619A, 619B may have substantially similar geometries. In other embodiments, however the two drivers 619C, 619D in the feedback generator 660 may be differently sized models of the drivers 619A, 619B. The drivers 619C, 619D both include a pull-up circuit 650 and a pull down circuit 654. A drive adjust circuit 652 is provided the feedback signal from the differential amplifier 665.

The feedback signal provided to the drivers 619A, 619B within the buffers 610A, 610B in FIG. 6 is the same for both buffers because both buffers in FIG. 6 have a substantially similar driver 619A, 619B. In other embodiments, however, the feedback signals provided to different buffers and/or to different drivers within a buffer may be different.

In general, the operation of the drivers 619A, 619B and buffers 610A, 610B in FIG. 6 is similar to the operation of the drivers 212A, 212B and buffers 212A, 212B in FIG. 2 as described in detail above, in that the pull-up drive strength of the drivers is dynamically adjusted in order to obtain substantially symmetric output signal shapes for the high-to-low and for the low-to-high transitions for the buffer 610A, and also in order to obtain substantially similar output signal shapes during transitions for the buffer 610A and the buffer 610B.

Figure 7:
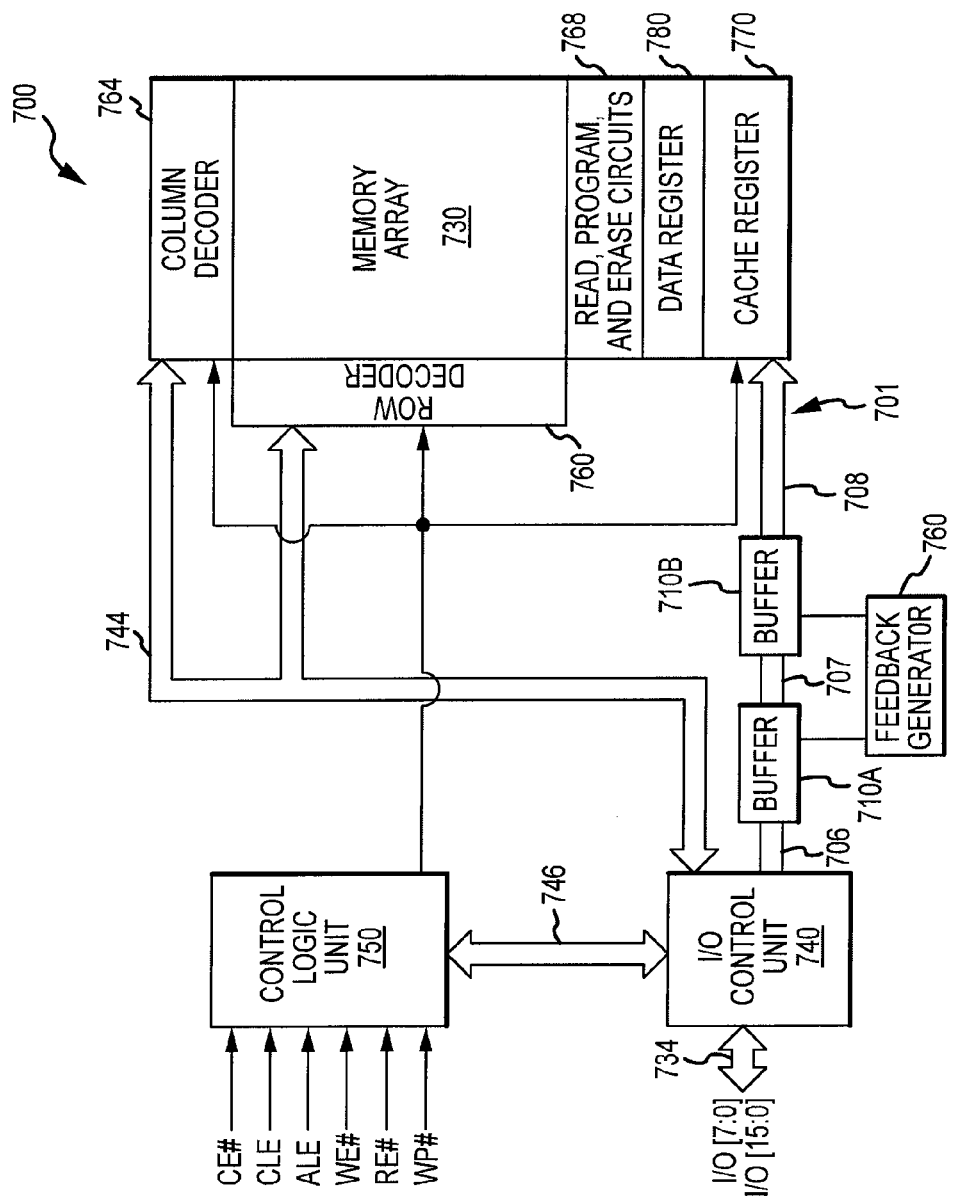
FIG. 7 is a block diagram of a memory system having adjustable buffers and a feedback generator according to an embodiment of the invention.

FIG. 7 illustrates a memory 700 including buffers with adjustable drive strength according to an embodiment of the present invention. The memory 700 includes an array 730 of memory cells. The memory cells may be NOR flash memory cells, but may also be DRAM, SDRAM, or any other type of memory cells. Command signals, address signals and write data signals may be provided to the memory 700 as sets of sequential input/output ("I/O") signals transmitted through an I/O bus 734. Similarly, read data signals may be provided from the flash memory 700 through the I/O bus 734. The I/O bus is connected to an I/O control unit 740 that routes the signals between the I/O bus 734 and an internal data bus, an internal address bus 744, and an internal command bus 746. The memory 700 also includes a control logic unit 750 that receives a number of control signals either externally or through the command bus 746 to control the operation of the memory 700.

The internal data bus may include a number of interconnect lines 701, some going from the I/O control unit 740 to the cache register 770, and some going from the cache register 770 to the I/O control unit 740. At least some of the lines 701 in the internal data bus going from the I/O control unit to the cache register 770 may be split into multiple segments 706, 707, 708, with buffers 710A, 710B placed between segments, and a feedback generator 760 configured to provide each of the buffers with a feedback signal as described above.

The address bus 744 applies block-row address signals to a row decoder 760 and column address signals to a column decoder 764. The row decoder 760 and column decoder 764 may be used to select blocks of memory or memory cells for memory operations, for example, read, program, and erase operations. The column decoder 764 enables write data signals to be applied to columns of memory corresponding to the column address signals and allow read data signals to be coupled from columns corresponding to the column address signals.

In response to the memory commands decoded by the control logic unit 750, the memory cells in the array 730 are read, programmed, or erased. Read, program, and erase circuits 768 coupled to the memory array 730 receive control signals from the control logic unit 750 and include voltage generators for generating various pumped voltages for read, program and erase operations.

After the row address signals have been applied to the address bus 744, the I/O control unit 740 routes write data signals to a cache register 770. The write data signals are stored in the cache register 770 in successive sets each having a size corresponding to the width of the I/O bus 734. The cache register 770 sequentially stores the sets of write data signals for an entire row or page of memory cells in the array 730. All of the stored write data signals are then used to program a row or page of memory cells in the array 730 selected by the block-row address coupled through the address bus 744. In a similar manner, during a read operation, data signals from a row or block of memory cells selected by the block-row address coupled through the address bus 744 are stored in a data register 780. Sets of data signals corresponding in size to the width of the I/O bus 734 are then sequentially transferred through the I/O control unit 740 from the data register 780 to the I/O bus 734.

As illustrated in FIGS. 1 through 7, a feedback generator may be used for an entire device if the drivers in the buffers are all substantially similar. However, a plurality of feedback generators may also be used, for example, locally in different regions of an integrated circuit in order to more quickly provide the feedback signal, reduce the interconnect lines carrying the feedback signal and so forth. Localized feedback generators may also provide more accurate modeling as the temperature and silicon properties can vary in different regions of a single chip. In devices where power consumption is an important design consideration, only a single or very few feedback generator(s) may be used in the device in order to minimize the static power that the feedback generator(s) dissipate in generating the feedback signal. In other devices where power consumption is not as important, more feedback generators may be used in order to increase the accuracy of the feedback signal, reduce the interconnect lines needed to propagate the feedback signal, increase the speed with which the feedback signal can be propagated to the buffers, and so forth.

As illustrated in FIG. 2, buffers with adjustable drive strength may include a single driver, and as illustrated in FIG. 4, the buffers may include three drivers coupled in series. As briefly mentioned above, however, the buffers may generally have any number and any type of drivers. For example, non-inverting buffers comprised of two substantially similar modified inverters (such as driver 212A in FIG. 2) may be used with a common feedback signal in order to avoid the polarity problem of inverting the signal as it propagates through the interconnect lines. As another example, four drivers of increasing geometrical size may be coupled in series in order to provide a non-inverting buffer. Other configurations and types of drivers may also be used, including NOR and NAND gates, tri-state buffers, and so forth. These other types of drivers may be modified similar to the modified inverters in FIGS. 2 through 6 with at least one FET or other drive adjust circuit receiving a feedback signal that adjusts the effective pull-down and/or pull-up strength of the drivers.

The buffers 410A, 410A in FIG. 4 and the buffers 610A, 610B in FIG. 6 may, like the buffers 210A, 210C in FIG. 2, correspond to the buffers 110B, 110C in FIG. 1. The buffers 110B, 110C in FIG. 1 may, however, generally have any number of drivers. For example, the buffers 110B, 110C in FIG. 1 may have one, two, three, four, five, six, or any number of serially coupled driver stages. The serially coupled drivers may or may not be substantially the same. The serially coupled drivers may be similar to one another but scaled (e.g., one driver may physically have a larger W/L ratio, or have the same W/L ratio but have a larger W and a larger L). Also, one or more of the one or more serially coupled drivers in the buffers 110B, 110C may have one or more drivers coupled in parallel. In general, similar drivers (whether they be substantially identical or similar but scaled) may receive a common feedback signal, whereas dissimilar drivers may receive different feedback signals.

Also, different configurations of buffers and/or feedback generators may be implemented to accommodate various operating conditions of a device. As just one example, devices with a standby mode may require data to be available within a window of recovery after coming out of standby. If the feedback generators are turned off during the standby mode, one or more mechanisms may allow the feedback generator to quickly generate a stable feedback signal and propagate it to all of the buffers such as: using a larger differential amplifier to more quickly distribute the feedback signal, using multiple, local feedback generators to avoid having too much load seen by the differential amplifier, adjusting the geometries of the model drivers and the actual drivers, and so forth. Alternatively, the feedback generators may be left on during standby. Other configurations of buffers and/or feedback generators may be implemented to accommodate other operating conditions, such as a sleep mode, a high performance mode, a low-power active mode, and so forth.

From the foregoing it will be appreciated that, although specific embodiments of the invention have been described herein for purposes of illustration, various modifications may be made without deviating from the spirit and scope of the invention. For example, FIGS. 2 and 4 illustrate embodiments of interconnect lines that includes two different types of buffers, and FIGS. 3 and 5 illustrate embodiments of feedback generators that provide feedback signals to the buffers in FIGS. 2 and 4 respectively. However, the buffers and feedback generators are not limited to having the designs illustrated in FIGS. 2 through 5, and may be of different designs and include different circuitry than that shown.

As another example, in the embodiment illustrated in FIG. 7, one or more interconnect lines within a bus between an I/O control unit and a cache register in a memory device have buffers with adjustable drive strengths. In other embodiments, however, other interconnect lines in a memory device may similarly have buffers with adjustable drive strengths. For example, the interconnect lines carrying address information may have such buffers, interconnect lines within the memory array may have such buffers, and so forth. Additionally, the buffers described herein may be used in any type of semiconductor device, such as a processor or microprocessor. Accordingly, the invention is not limited except as by the appended claims.

What is claimed is:

1. A buffer, comprising:
a driver, the driver comprising:
a pull-up circuit coupled to a supply voltage node and an output node;
a pull-down circuit coupled to a reference voltage node and the output node; and
a drive adjust circuit coupled to at least one of the pull-up circuit and the pull-down circuit, the drive adjust circuit configured to receive a feedback signal and, based at least in part on the feedback signal, adjust a current conducted through the at least one of the pull-up and pull-down circuits;
wherein the feedback signal is provided by a feedback generator, the feedback generator comprising:
a differential amplifier with a positive input node, a negative input node, and an output node;
a first model driver coupled to the positive input node of the differential amplifier and configured to model a driving driver; and
a second model driver coupled to the negative input node of the differential amplifier and configured to model a receiving driver,
wherein the feedback signal is provided from the output node of the differential amplifier.

2. The buffer of claim 1, wherein the drive adjust circuit is coupled to the pull-down circuit and is configured to adjust the current conducted through the pull-down circuit.

3. The buffer of claim 1, wherein the pull-up circuit comprises a p-channel field effect transistor (pFET) and the pull-down circuit comprises an n-channel field effect transistor (nFET).

4. The buffer of claim 3, wherein the drive adjust circuit comprises an nFET coupled in series between the pull-down circuit and the output node.

5. The buffer of claim 1 wherein the first and second model drivers are scaled with lower W/L ratios of the pull-up and pull-down circuits.

6. The buffer of claim 1, wherein the driver is a first driver and further comprising:
a second driver.

7. The buffer of claim 6, wherein the second driver is coupled in parallel with the first driver.

8. An integrated circuit, comprising:
an interconnect line with a first and a second segment;
a buffer coupled between the first segment and the second segment and configured to drive a signal received from the first segment onto the second segment, the buffer comprising a driver; and
a feedback circuit configured to model the driver, model a receiving driver, and generate a feedback signal based at least in part on the modeling of the driver and the receiving driver,
wherein the driver includes a first circuit with a first drive strength, a second circuit with a second drive strength, and a drive adjust circuit, the drive adjust circuit configured to receive the feedback signal and, based at least in part on the feedback signal, is configured to control current through the first circuit when the first circuit is activated to be substantially equal to current through the second circuit when the second circuit is activated.

9. The integrated circuit of claim 8, wherein the first circuit is a pull-up circuit, and the first drive strength is a pull-up current drive strength.

10. The integrated circuit of claim 8 wherein the current through the first circuit is controlled by the drive adjust circuit by restricting the current through the first circuit based at least in part on the feedback signal.

11. The integrated circuit of claim 8, wherein the signal includes high-to-low transitions and low-to-high transitions, and the drive adjust circuit is configured to control current through the first circuit based at least in part on the feedback signal to provide a first output signal of the buffer during a high-to-low transition that is substantially symmetric to a second output signal of the buffer during a low-to-high transition.

12. The integrated circuit of claim 8, wherein the buffer is a first buffer, the driver is a first driver, the drive adjust circuit is a first drive adjust circuit, the feedback signal is a first feedback signal, the first feedback signal is generated in a first feedback generator, and the interconnect line further comprises a third segment, the integrated circuit further comprising:

a second buffer coupled between the second segment and the third segment and configured to drive the signal received from the second segment onto the third segment, the second buffer comprising a second driver wherein the second driver includes a third circuit with a third drive strength, a fourth circuit with a fourth drive strength, and a second drive adjust circuit, the second drive adjust circuit configured to receive a second feedback signal and based at least in part on the second feedback signal configured to control current through the third circuit when the third circuit is activated to be substantially equal to current through the fourth circuit when the fourth circuit is activated.

13. The integrated circuit of claim 12, wherein the second feedback signal is generated in a second feedback generator, the second feedback generator being distinct from the first feedback generator.

14. A method for adjusting drive strength of a driver in a buffer, comprising:

modeling a driving driver with a first model driver;
modeling a receiving driver with a second model driver;
generating a feedback signal based at least in part on the difference between the output of the first and second model drivers;
receiving the feedback signal at a drive adjust circuit of the driving driver; and
adjusting the drive strength of the driving driver as a function of the feedback signal received at the drive adjust circuit.

15. The method of claim 14, wherein the driving driver has a pull-up circuit and a pull-down circuit.

16. The method of claim 15, wherein the drive adjust circuit is coupled to the pull-down circuit.

17. The method of claim 16, wherein current conducted through the pull-down circuit is adjusted based at least in part on the feedback signal.

18. The method of claim 14, wherein the driving driver is a first driving driver, the receiving driver is a first receiving driver, the feedback signal is a first feedback signal, and the drive adjust circuit is a first drive adjust circuit, the method further comprising:

modeling a second driving driver with a third model driver;
modeling a second receiving driver with a fourth model driver;
generating a second feedback signal based at least in part on the difference between the output of the third and fourth drivers;
receiving the second feedback signal at a second drive adjust circuit of the second driving driver; and
adjusting the drive strength of the second driving driver as a function of the second feedback signal received at the second drive adjust circuit.

19. The method of claim 14, wherein the buffer further comprises at least one additional driving driver coupled in parallel to the driving driver and the drive adjust circuit is a first drive adjust circuit, the method further comprising:

receiving the feedback signal at a second drive adjust circuit of the at least one additional driving driver; and
adjusting the drive strength of the at least one additional driving driver as a function of the feedback signal received at the second drive adjust circuit.

20. An apparatus including a buffer configured to drive a signal, the buffer comprising:

a pull-up circuit;
a pull-down circuit;
a drive adjust circuit coupled between the pull-up circuit and the pull-down circuit, the drive adjust circuit being configured to receive the feedback signal and to adjust the effective drive strength of the pull-down circuit and/or the pull-up circuit; and
a feedback circuit configured to model the pull-up circuit, the pull-down circuit, and the drive adjust circuit, and to model a receiving driver, and generate the feedback signal based at least in part on the modeling of the pull-up circuit, the pull-down circuit, and the drive adjust circuit, and the receiving driver,
wherein the buffer is configured to receive the feedback signal, and wherein an effective drive strength of the pull-down circuit and/or the pull-up circuit is configured to be adjusted, responsive to the feedback signal, so that a transition rate of rising and falling edges of the signal are substantially symmetrical.

21. The apparatus of claim 20, wherein the drive adjust circuit being configured to adjust the effective drive strength of the pull-down circuit and/or the pull-up circuit comprises the drive adjust circuit being configured to adjust the effective drive strength of the pull-down circuit, and wherein the drive adjust circuit is coupled in series with the pull-down circuit.

22. The apparatus of claim 21, wherein the effective drive strength of the pull-down circuit comprises a pull-down current drive strength of a series combination of the drive adjust circuit and the pull-down circuit, and wherein the pull-down current drive strength of the series combination is greater than a pull-up drive strength of the pull-up circuit when the drive adjust and pull-down circuits are fully conductive.

23. The apparatus of claim 22, wherein an effective drive strength of the pull-down circuit and/or the pull-up circuit being configured to be adjusted, responsive to the feedback signal, so that a transition rate of rising and falling edges of the signal are substantially symmetrical comprises the effective drive strength of the pull-down circuit being configured to be adjusted, responsive to the feedback signal, so that the effective drive strength of the pull-down circuit is substantially equal to a drive strength of the pull-up circuit.

24. The apparatus of claim 21, wherein the drive adjust circuit being configured to adjust the effective drive strength of the pull-down circuit and/or the pull-up circuit comprises the drive adjust circuit being configured to adjust the effective drive strength of the pull-up circuit, and wherein the drive adjust circuit is coupled in series with the pull-up circuit.

25. The apparatus of claim 20, further comprising a feedback generator configured to generate the feedback signal.

26. The apparatus of claim 25, wherein the feedback generator includes a model of the pull-up and pull-down circuits.

27. An apparatus including a buffer configured to drive a signal, the buffer comprising a driver having a pull-up drive strength and a pull-down drive strength, wherein the buffer is configured to adjust at least one of the pull-up and pull-down drive strengths responsive to a feedback signal so that a transition rate of rising and falling edges of the signal are substantially symmetrical;

the apparatus further comprising a feedback circuit configured to model the driver, model a receiving driver, and generate the feedback signal based at least in part on the modeling of the driver and the receiving driver.

* * * * *

UNITED STATES PATENT AND TRADEMARK OFFICE
CERTIFICATE OF CORRECTION

PATENT NO. : 8,754,695 B2  
APPLICATION NO. : 13/221752  
DATED : June 17, 2014  
INVENTOR(S) : Di Vincenzo et al.

Page 1 of 1

It is certified that error appears in the above-identified patent and that said Letters Patent is hereby corrected as shown below:

In the Claims

Column 16, line 49, Claim 24, delete "claim 21," and insert -- claim 20, --, therefor.

Signed and Sealed this  
Sixth Day of January, 2015

Michelle K. Lee  
*Deputy Director of the United States Patent and Trademark Office*